United States Patent [19]
Field et al.
[11] 3,725,064
[45] Apr. 3, 1973

[54] PHOTOSENSITIVE PROPARGYL POLYMER COMPOSITION AND METHOD OF USING

[75] Inventors: Nathan D. Field, Allentown; Harlan B. Freyermuth, Easton, both of Pa.

[73] Assignee: GAF Corporation, New York, N.Y.

[22] Filed: Nov. 8, 1971

[21] Appl. No.: 196,777

Related U.S. Application Data

[62] Division of Ser. No. 35,551, May 7, 1970, Pat. No. 3,657,197.

[52] U.S. Cl. .............96/35.1, 96/115 R, 204/159.14, 204/159.18
[51] Int. Cl. ..............................G03c 1/68, G03c 1/70
[58] Field of Search .......96/115 R, 35.1; 204/159.18, 204/159.14

[56] References Cited

UNITED STATES PATENTS

| | | | |
|---|---|---|---|
| 3,501,297 | 3/1970 | Cremeans | 96/115 R |
| 3,594,175 | 7/1971 | Hay | 96/115 R |
| 3,679,738 | 7/1972 | Cremeans | 96/115 R |

*Primary Examiner*—Ronald H. Smith
*Attorney*—W. C. Kehm et al.

[57] ABSTRACT

A light-sensitive solvent soluble film-forming polymer containing a propargyl group is disclosed. The propargyl group-containing polymers can be used as a photoresist with or without a sensitizer. In another aspect of the disclosure, a sensitizer-stabilizer comprising a xanthen-9-one or a thioxanthen-9-one is disclosed.

8 Claims, No Drawings

PHOTOSENSITIVE PROPARGYL POLYMER COMPOSITION AND METHOD OF USING

This is a division of application Ser. No. 35,551, filed May 7, 1970, now U.S. Pat. No. 3,657,197.

This invention relates to propargyl polymer derivatives and more particularly this invention relates to light-sensitive propargyl polymer derivatives and to the photosensitization of the same.

It is well known in the art of photochemical reproduction to utilize various materials, such as bichromated shellac, albumin, or polyvinyl alcohol for forming resist images upon various supports, such as metal plates. The support is then etched or otherwise treated in the areas not covered by the resist image and the resultant plate, usually after removal of the resist image, is used for printing. One method of forming relief images on metal supports is disclosed in U.S. Pat. No. 1,965,710, which issued July 10, 1934, and includes using as a sensitive layer for forming a resist image a layer of cinnamal ketone containing another resinous material which, after exposure under a design, may be selectively dissolved in the unexposed area, whereby the area of the support thus bared may be etched.

A later development in the art of photochemical reproduction was the discovery that cinnamic acid esters of polymeric material, such as polyvinyl cinnamate, are particularly useful as photoresists. These compounds are described in U.S. Pat. No. 2,610,120, issued Sept. 9, 1952. In later developments, various compounds were found to photosensitize the cinnamic acid esters, thereby enhancing their usefulness as photoresists.

The applications of photoresists in modern technology are numerous. The most noteworthy, but by no means only, such applications are:

1. Printed circuits
2. Semiconductors for integrated circuits
3. Weight reduction of small metal parts
4. Small parts manufacture
5. Decorator designs
6. Chemical milling
7. Tool and die fabrication
8. Name plates While cinnamic acid esters are known to possess the necessary characteristics for use as photoresists, a need has existed for other compounds possessing the same characteristics as alternatives to the cinnamic acid esters. There are several characteristics which such compounds must possess. Among these are that they must be sensitive to light, soluble in organic solvents, and capable of forming films. The light sensitivity can be either natural or imparted, or enhanced, by sensitizer additives.

A new class of compounds has now been discovered which possesses all the attributes necessary for use as a photoresist. These compounds are light-sensitive solvent soluble film-forming propargyl polymer derivatives. These derivatives are the propargyl and substituted propargyl esters, amides, and thioesters of certain polymers.

Accordingly, it is a primary object of the present invention to provide a new class of compounds, suitable for use as photoresists.

It is another object of the present invention to provide a class of light-sensitive solvent soluble film-forming polymers.

It is a further object of the present invention to provide a class of propargyl polymer derivatives, which are light-sensitive, organic solvent soluble, and capable of forming films.

It is yet another object of the present invention to describe a preferred application of the compounds of the present invention.

As already mentioned, the polymers of the present invention are light-sensitive and therefore useful as photoresists. In some applications, it is helpful to enhance the sensitivity of the polymers, as well as to stabilize solutions of the same. Sensitizers which are useful in other systems have been found not to have the proper effect on the novel propargyl polymers of the present invention. For example, 1-methyl-2-benzoylmethylene-β-naphthothiazolene, which is a useful sensitizer for the cinnamate ester of polyvinyl alcohol does not sensitize the photoresist system of the present invention.

It has been found, however, that thioxanthen -9-one and xanthen-9-one and their derivatives are capable of sensitizing the propargyl polymers of the present invention. Further, it has unexpectedly been found that these sensitizers also act as stabilizers, so that a solution of the polymer in methyl ethyl ketone did not set to a gel on standing, as it would in the absence of a stabilizer.

Accordingly, it is another primary object of the present invention, consistent with the foregoing objects, to provide a sensitized and stabilized photoresist composition.

In accordance with the present invention, there is provided a light-sensitive organic solvent soluble film-forming polymer consisting of recurring structural units having the general formula

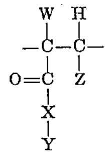

wherein W represents a member of the group consisting of hydrogen, alkyl radicals, aryl radicals, and halogen; X represents a radical selected from the group consisting of —O—, —S—, and

R represents a member of the group consisting of hydrogen, alkyl, and aryl radicals; Y represents a member of the group consisting of substituted and unsubstituted propargyl radicals; Z represents a radical selected from the group consisting of hydrogen, alkyl, aryl,

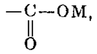

and

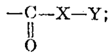

and M represents a member of the group consisting of hydrogen, alkali metal ions, ammonium ion, substituted ammonium ion, alkyl and aryl radicals.

The propargyl and substituted propargyl esters, amides, and thioesters may be prepared by reacting polymeric anhydrides, acid halides, or carboxylic acids with the appropriate propargyl alcohol, amine, or mercaptan. The reactions can be run in an excess of the propargyl reactant, or in the presence of an inert solvent such as 2-methoxyethyl acetate
xylene
acetone
methyl ethyl ketone
diethyl ether
2-ethoxyethyl acetate
toluene
cyclohexane
cyclohexanone
methyl isobutyl ketone
butyl acetate
amyl acetate
and the like A reactive solvent such as pyridine, which could act as a hydrogen halide acceptor, may be used in the case of the polymeric acid halide. Various catalysts, such as bases and acids, may be used to increase the rate of reaction.

The reaction temperature may vary considerably, depending upon the reactivities of the reactants. For instance, amines are generally more reactive than alcohols and require less stringent conditions, e.g., amide formation may be carried out at room temperature or below. Reactivity of certain alcohols is sometimes much slower, and in order to increase the rate of reaction, it may be desirable to run the condensation reaction at an elevated temperature, for instance, at 100° C or higher, and also to use one of the above-mentioned classes of catalysts.

The propargyl alcohols have the general formula $$HO-\overset{\displaystyle R}{\underset{\displaystyle R}{\overset{|}{\underset{|}{C}}}}-C\equiv C-R$$

wherein each R = H, alkyl or aryl

Examples of such substituted propargyl alcohols are:

$CH\equiv C-CH_2OH$
$CH_3-CH(OH)-C\equiv CH$
$CH_3-CH_2-CH(OH)-C\equiv CH$
$CH_3-CH_2-C(CH_3)(OH)-C\equiv CH$
$CH_3-(CH_2)_4-C\equiv C-CH_2OH$
$CH_3(CH_2)_3-C(CH_3)(OH)-C\equiv CH$
$CH_3(CH_2)_4-C(CH_3)(OH)-C\equiv CH$
$CH_3CH_2CH_2)_2-C(OH)-C\equiv CH$
$HC\equiv C-C(CH_3)(OH)-(CH_2)_3-CH(CH_3)2$
$(CH_3)_2-C(OH)-C\equiv C-C_2H_5$
$CH_3-(CH_2)5-C\equiv C-CH_2OH$
$CH_3-(CH_2)_4-C\equiv C-CH(CH_3)(OH)$
$CH_3-CH(OH)-C\equiv C-(CH_2)_5-CH_3$
$C_6H_5-C\equiv C-CH_2OH$
$C_6H_5C\equiv C-CH(OH)-CH_3$
$C_6H_5-C\equiv C-CH(OH)-CH_2-CH_3$
$C_6H_5-CH(OH)-C\equiv C-C_2H_5$
$C_6H_5-C\equiv C-CH(CH_3)(OH)$
$C_6H_5C\equiv C-CH(OH)-C_3H_7$
$C_6H_5-C\equiv C-C(CH_3)(OH)-CH_2-CH(CH_3)_2$
$CH_3-C\equiv C-CH_2OH$
$CH_3CH_2$bk$-C\equiv C-CH_2OH$ $C_6H_5C\equiv C\,C(OH)(CH_3)-CH_2-CH(CH_3)_2$
$C_6H_5-CH(OH)-C\equiv C-CH_2-CH_2-CH_3$
$C_6H_5-C\equiv C-C(OH)(C_2H_5)-CH_2-CH_2-CH_3$
$C_6H_5-C\equiv C-C(OH)(CH_3)-C(CH_3)_3$ Examples of the propargyl amines used for the present invention are:

propargylamine
2-butynl-1-amine (butyne-2-ylamine)
2-pentynyl-1-amine (3-ethyl-propargylamine)
3-phenylpropargylamine
N-isobutyl propargylamine
N-isoamyl propargylamine As examples of polymeric anhydrides which are useful as intermediates for the preparation of the light sensitive propargyl esters, amides and thiols of the present invention may be mentioned polymers derived from maleic anhydride and itaconic anhydride. A preferred form of polymeric anhydride consists of copolymers of maleic anhydride with other ethylenically unsaturated monomers such as alkyl vinyl ethers, wherein the alkyl group could be for example methyl, ethyl, propyl, butyl, cetyl or octadecyl. Further, the alkyl could be substituted with an aryl group, thereby providing an ether such as benzyl vinyl ether and the like. The maleic or itaconic anhydrides could also be copolymerized with such other comonomers as styrene, ethylene, N-vinylpyrrolidinone and the like. A number of such maleic anhydride copolymers are described in U.S. Pat. No. 2,047,398, as is their preparation.

Some typical copolymers of maleic anhydride suitable for preparation of the light-sensitive polymers of this invention, their mol ratios and relative viscosities are given in the table below:

| Copolymer | Mol Ratio | Relative Viscosity in 1% Methyl Ethyl Ketone |
|---|---|---|
| Methyl vinyl ether/maleic anhydride | 1:1 | 4.0 |
| n-butyl vinyl ether/maleic anhydride | 1:1 | 2.2 |
| n-butyl vinyl ether/maleic anhydride | 1:1 | 1.59 |
| Isobutyl vinyl ether/maleic anhydride | 1:1 | 3.93 |
| Isobutyl vinyl ether/maleic anhydride | 1:1 | 1.66 |
| Octadecyl vinyl ether/maleic anhydride | 1:1 | 1.91 |
| Isoctyl vinyl ether/maleic anhydride | 1:1 | 1.91 |
| Dodecyl vinyl ether/maleic anhydride | 1:1 | 1.52 |
| Cetyl vinyl ether/maleic anhydride | 1:1 | 1.20 |
| Styrene/maleic anhydride | 1:1 | 2.82 |
| Ethylene/maleic anhydride | 1.5:1 | 2.44 (1% in N-methyl 2-pyrrolidinone) |
| Vinyl pyrrolidinone/maleic anhydride | 1:1 | 1.16 (1% in $H_2O$) |

As examples of polymeric acid halides which are suitable for use as intermediates for the preparation of the light sensitive propargyl derivatives of this invention may be mentioned the polymeric acid halides of acrylic acid and methacrylic acid which may be prepared either by the direct polymerization of corresponding unsaturated acid halides or by the conversion of the aforesaid polyacrylic or polymethacrylic acids into the acid halides as by reaction with thionyl chloride. The novel propargyl esters of polymeric acrylic and methacrylic acid employed in the present invention may also be conveniently prepared by transesterification, with propargyl alcohol, of a polymer of a lower alkyl ester of an acrylic acid or methacrylic acid, e.g., polymethylacrylate, polyethylacrylate, polymethyl-methacrylate or polyethylmethacrylate. These products are soluble in organic solvents such as acetone, methyl ethyl ketone 2-methoxy-ethyl acetate, ethyl acetate, and the like. Photoresists with salt groups are soluble in water.

The photoresists of the present invention are sensitive to light exposure, particularly in the ultraviolet region. The photoresists are much less sensitive to visible light than to ultraviolet radiation. Sensitizers may be used to increase the sensitivity. For example, when plate glass photographic masks are used which filter out ultraviolet light while allowing visible light to strike the photoresist plate, the sensitivity is markedly improved by the inclusion of certain sensitizers.

The mechanism involved in the formation of the photoresist is not thoroughly understood, but it is felt that cross-linking between two ethynyl groups of separate polymer molecules may take place. It is not known what role the other functional groups present play in this mechanism of crosslinking.

The photosensitivity of the polymers of the present invention results from an interplay of the inherent photosensitivity of the particular propargyl or substituted propargyl groups involved, the percentage of these groups per average polymer chain, and the molecular weight of the base polymer. For a given percentage of a particular propargyl group, the higher the molecular weight of the base polymer, the more sensitive the final polymer will be. Conversely, the higher the molecular weight of the base polymer, the lower need be the percentage of a particular propargyl group per polymer chain to achieve a given level of photosensitivity. Further, a propargyl group which is more sensitive than another requires either a smaller percentage of the same per polymer chain and/or a lower molecular weight base polymer to achieve a given level of photosensitivity when comparing the two polymers. The use of a sensitizer, according to a further aspect of the present invention, of course, complicates the relationship.

According to the other aspect of the present invention, the propargyl group containing polymers can be further sensitized, as well as stabilized, by the use of a sensitizer-stabilizer having one of the following general formulas

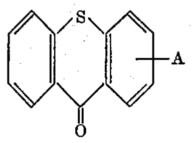

and

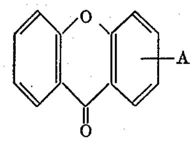

wherein A represents a member of the group consisting of hydrogen, alkyl, alkoxy, halogen, cyano, amino, alkylamino, and acyl-amino radicals.

EXAMPLE I

A 250 ml. 3-necked flask equipped with a stirrer, condenser, thermometer and surrounded by an ice-water bath was charged with 50 ml. methyl ethyl ketone. Upon cooling to 5°–10° C, 7.8 g. (0.05 mole) copolymer of methylvinyl ether and maleic anhydride (having a relative viscosity of 4.0 in 1 percent methyl ethyl ketone) was added during 5 minutes with continued stirring. The mixture became clear and viscous after 15 minutes. Ten drops of N-methyl-morpholine and 25 ml. (24.3 g.) propargyl alcohol were added and the mixture was allowed to warm gradually to room temperature during a 2 hour period. The mixture was then heated to 70°–75° C by an oil bath. The oil bath temperature was 80°–85° C. After 2 hours and 45 minutes heating and stirring, the formation of the half ester was nearly completed and very little anhydride was present, as determined by infrared specular reflectance technique.

A photoresist of the propargyl half ester of the methylvinyl ether maleic anhydride copolymer was made by applying a film of the product (14.5% solution in methylethyl ketone) to a glass plate with the aid of a 2 mil Bird film applicator. The coated glass plate was dried in an electric oven at 55°–60° C for 15 minutes. A black and white high contrast negative was placed over the film of polymer and portions of the film were given various exposures (5, 10, 15, 20, and 30 seconds) at a distance of 6 inches from a 450 watt Hanovia quartz high pressure mercury lamp (type L). The unexposed polymer was removed by development with a mixture of 75 percent methylethyl ketone and 25 percent 2-methoxyethyl acetate. The 10 to 30 second exposure areas were all excellent. The developed film was given a 20 minute heat curing treatment at 60° C in an electric oven.

One-half of the mixture from the reaction of propargyl alcohol and the copolymer of methylvinyl ether and maleic anhydride was isolated by pouring into water and grinding the precipitated polymer with water in a Waring blender. The product was filtered on a Buchner funnel, washed with water. One-half of this material was bottled and saved for storage stability tests and the other half was dissolved in 20 ml. methyl ethyl ketone. The other one-half of the reaction mixture was isolated by drowning in 200 ml. carbon tetrachloride. The precipitated polymer was mechanically squeezed as dry as possible and dissolved in 40 ml. methyl ethyl ketone.

EXAMPLE II

A 500 ml. 3-necked flask equipped with a stirrer, thermometer, condenser, Y tube and dropping funnel was immersed in an oil bath heated to 100°–105° C. A mixture of 30.1 g. (32 ml., 0.35 mole) methyl acrylate, 30 g. (35 ml.) benzene and 0.06 g. benzoyl peroxide was placed in the dropping funnel. The solution was added to the heated flask with stirring during one-half hour. The temperature of the reaction mixture was about 75°–80° during this period and this temperature was maintained for one hour. The next morning, the viscous poly(methyl acrylate) was diluted with 70 ml. toluene and stirred until homogeneous. To this solution of polymer was added 123 g. (130 ml.) propargyl alcohol and 0.3 g. tetrabutyl titanate. This mixture was heated to reflux (92°–93° C) for 6 hours (oil bath temperature 108°–110° C). A sample of the transesterified poly(methyl acrylate) with propargyl alcohol was cast on a glass plate as in Example I and after exposure for one minute and development with methyl ethyl ketone gave a satisfactory photoresists.

EXAMPLE III

A solution of the propargyl half ester of the copolymer of methylvinyl ether and maleic anhydride as prepared in Example I in methylethyl ketone (containing 3.3 percent solids) and 5 percent thioxanthen-9-one (based on weight polymer) was cast on glass plate by means of a 3 mil Bird film applicator. The coated glass plate was dried in an electric oven at 55°–60 C for 10 minutes. A photographic mask on plate glass was placed over the film of polymer and portions of the film were given various exposures (5, 10, 15, 20, and 30 seconds) at a distance of 6 inches from a 450 watt Hanovia quartz high pressure mercury lamp (type L). The photoresist was developed by heating for two minutes with a solvent mixture containing 75 percent methyl ethyl ketone and 25 percent 2-methoxyethyl acetate. The 10 to 30 second exposure areas were all excellent.

EXAMPLE IV

The procedure of Example III was repeated except that 5 percent (based on weight of polymer) of xanthen-9-one was used in place of thioxanthen-9-one. Excellent photoresists were produced after 10, 15, 20, and 30 second exposures and development of the photoresists.

What is claimed is:

1. A photomechanical resist composition comprising a light-sensitive organic solvent soluble film-forming polymer consisting of recurring structural units having the general formula

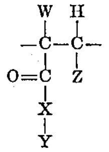

wherein W represents a member of the group consisting of hydrogen, alkyl radicals, aryl radicals, and halogen; X represents a radical selected from the group consisting of —O—, —S—, and

R represents a member of the group consisting of hydrogen, alkyl, and aryl radicals; Y represents a member of the group consisting of substituted and unsubstituted propargyl radicals; Z represents a radical selected from the group consisting of hydrogen, alkyl, aryl,

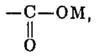

and

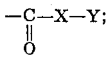

and M represents a member of the group consisting of hydrogen, alkali metal ions, ammonium ion, substituted ammonium ion, alkyl and aryl radicals; and as a sensitizer-stabilizer for said polymer a member of the group consisting of

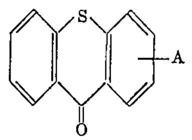

and

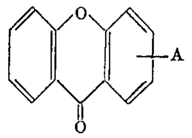

wherein A presents a member of the group consisting of hydrogen, alkyl, alkoxy, halogen, cyano, amino, alkylamino, and acylamino radicals.

2. A composition according to claim 1, wherein said polymer is prepared by the reaction of propargyl alcohol with a copolymer of methyl vinyl ether and maleic anhydride.

3. A composition according to claim 2, wherein said sensitizer-stabilizer is thioxanthen-9-one.

4. A composition according to claim 2, wherein said sensitizer-stabilizer is xanthen-9-one.

5. A method of producing a printing plate which comprises selectively exposing a supported layer of a light-sensitive solvent soluble film-forming polymer consisting of recurring structural units having the general formula

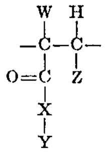

wherein W represents a member of the group consisting of hydrogen, alkyl radicals, aryl radicals, and halogen; X represents a radical selected from the group consisting of —O—, —S—, and

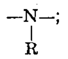

R represents a member of the group consisting of hydrogen, alkyl, and aryl radicals; Y represents a member of the group consisting of substituted and unsubstituted propargyl radicals; Z represents a radical selected from the group consisting of hydrogen, alkyl, aryl,

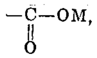

and

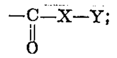

and M represents a member of the group consisting of hydrogen, alkali metal ions, ammonium ion, substituted ammonium ion, alkyl and aryl radicals; activating said polymer in the presence of actinic rays to render it insoluble in an organic solvent, thereby insolublizing said polymer only in the exposed region of said layer; and dissolving only the unexposed region of said layer with an organic solvent leaving the polymer on the support in relief form in the exposed region.

6. A method according to claim 5, wherein said polymer is prepared by the reaction of propargyl alcohol with a member of the group consisting of methyl vinyl ether-maleic anhydride copolymer and poly(methylacrylate).

7. A method according to claim 5, wherein said solvent is methyl ethyl ketone.

8. A method according to claim 5, wherein said supported layer of said polymer further includes as a sensitizer-stabilizer for said polymer a member of the group consisting of

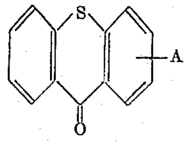

and

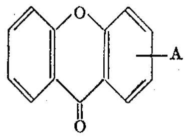

wherein A represents a member of the group consisting of hydrogen, alkyl, alkoxy, halogen, cyano, amino, alkylamino, and acylamino radicals.

* * * * *